(12) United States Patent
Sohn et al.

(10) Patent No.: US 7,521,525 B2
(45) Date of Patent: Apr. 21, 2009

(54) BLUE LUMINESCENT POLYMER AND ORGANOELECTROLUMINESCENT DEVICE USING THE SAME

(75) Inventors: Byung-Hee Sohn, Yongin-si (KR); Woon-Jung Paek, Yongin-si (KR); Myung-Sup Jung, Seongnam-si (KR); In-Nam Kang, Ansan-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 461 days.

(21) Appl. No.: 11/155,778

(22) Filed: Jun. 20, 2005

(65) Prior Publication Data
US 2006/0063033 A1    Mar. 23, 2006

(30) Foreign Application Priority Data
Sep. 18, 2004    (KR) ............. 10-2004-0074826

(51) Int. Cl.
*C08G 61/12*    (2006.01)
*H01L 51/54*    (2006.01)
*C09K 11/06*    (2006.01)

(52) U.S. Cl. ............. 528/423; 528/394; 528/397; 428/690; 428/917; 313/504; 313/506; 257/40; 257/E51.032; 257/E51.036; 252/301.35

(58) Field of Classification Search ............ 428/690, 428/917; 427/58, 66; 313/502–509; 257/40, 257/88–103, E51.001–E51.052; 252/301.16–301.35; 528/423
See application file for complete search history.

(56) References Cited

U.S. PATENT DOCUMENTS

| 6,169,163 | B1 | 1/2001 | Woo et al. | |
|---|---|---|---|---|
| 2003/0094595 | A1* | 5/2003 | Son et al. | 252/301.16 |
| 2004/0137271 | A1* | 7/2004 | Sohn et al. | 428/690 |
| 2004/0192871 | A1* | 9/2004 | Wang et al. | 528/4 |
| 2005/0038223 | A1* | 2/2005 | Becker et al. | 528/86 |

FOREIGN PATENT DOCUMENTS

WO    WO 03020790    *    3/2003

OTHER PUBLICATIONS

Li et al., "Novel Peripherally Substituted Indolo[3,2-b]carbazoles for High-Mobility Organic Thin-Film Transistors," *Advanced Materials*, vol. 17, No. 7, pp. 849-853, Apr. 2005.*
D.Sainova, et al. (2000). "Control of color and efficiency of light-emitting diodes based on polyfluorenes blended with hole-transporting molecules." *Applied Physics Letters*. vol. 76, No. 14.
O.Stephan, et al. (1999). "Blue light electroluminescent devices based on a copolymer derived from fluorene and carbazole," *Synthetic Metals*. vol. 106.

* cited by examiner

*Primary Examiner*—Marie R. Yamnitzky
(74) *Attorney, Agent, or Firm*—Robert E. Bushnell, Esq.

(57) ABSTRACT

A blue light polymer containing an indenocarbazole unit in its main polyarylene chain and an organoelectroluminescent device using the same are provided. The organoelectroluminescent device exhibits high luminous efficiency and high color purity.

11 Claims, 5 Drawing Sheets

BLUE LUMINESCENT POLYMER AND ORGANOELECTROLUMINESCENT DEVICE USING THE SAME

CLAIM OF PRIORITY

This application claims the benefit of Korean Patent Application No. 10-2004-0074826, filed on Sep. 18, 2004, in the Korean Intellectual Property Office, the disclosure of which is incorporated herein in its entirety by reference.

BACKGROUND OF THE INVENTION

1. Field of the Invention

The present invention relates to a blue luminescent polymer and an organoelectroluminescent device using the same, and more particularly, to a blue luminescent polymer containing an indeno (or indolo) carbazole unit in its main polyarylene chain and an organoelectroluminescent device using the same, thus having high emission efficiency and high color purity.

2. Description of the Related Art

Organic electroluminescent devices (organic EL devices) are active emission display devices. When a current is provided to fluorescent or phosphor organic compounds thin films (organic films), electrons and holes are combined in the organic films, thus emitting light. Organic EL devices have many advantages, such as being lightweight, a simplified manufacturing process, high resolution, and wide viewing angles. Further, the organic EL devices can completely realize a moving picture with excellent color purity and low power consumption. Therefore, such organic EL devices are suitable for portable electrics.

Organic EL devices are classified into low molecular weight organic EL devices and polymer EL devices according to a material for forming an organic film.

In low molecular weight organic EL devices, organic films are formed by vacuum deposition. Low molecular weight organic EL devices have many advantages. For example, emission materials for the low molecular weight organic EL devices can be easily refined to achieve high purity, and color pixels can be easily formed. However, such devices have problems, such as low quantum efficiency, crystallization of thin films, and low color purity.

Meanwhile, in polymer organic EL devices, organic films can be formed by spin coating or printing. The use of spin coating and printing simplifies the manufacturing process, and lowers manufacturing costs. In addition, such organic films have excellent mechanical characteristics.

However, polymer organic EL devices also have many disadvantages including low color purity, high operating voltage, low efficiency, and the like. As a result, much research into the polymer organic EL devices has been conducted to overcome these disadvantages. For example, polymers containing fluorene are copolymerized (U.S. Pat. No. 6,169,163 and Synthetic Metal, Vol. 106, pp. 115-119, 1999), or blended (Applied Physics Letter, Vol. 76, No. 14, pp. 1810, 2000) to improve electroluminescent characteristics. However, the current improvement of electroluminescent characteristics is far from a desirable level.

SUMMARY OF THE INVENTION

It is therefore an object of the present invention to provide a blue luminescent compound.

It is also an object of the present invention to provide an improved light emitting device.

It is a further object of the present invention to provide a luminescent compound having high charge mobility and good structural stability, and in particular, having improved color coordinate characteristics in a blue range.

The present invention also provides an organoelectroluminescent device using the luminescent compound, thus having excellent operating characteristics, in particular, high color purity.

According to an aspect of the present invention, there is provided a polymer represented by Formula 1.

According to another aspect of the present invention, there is provided an organoelectroluminescent device including an organic film interposed between a pair of electrodes. The organic film is composed of an indeno (or indolo) carbazole polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

A polymer containing an indenocarbazole (also known as 'indolocarbazole') unit in its main polyarylene chain is provided. The indenocarbazole unit has an excellent charge transporting ability, in particular, hole transporting ability, and excellent blue light emission characteristics.

A polymer is represented by Formula 1:

[Formula 1]

where Ar is a substituted or unsubstituted C6-C30 arylene group or a substituted or unsubstituted C2-C30 heteroarylene group;

Y is N or C($R_1$);

$R_1$ through $R_{11}$ are each independently H, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C5-C30 heteroaryl group, a substituted or unsubstituted C5-C30 heteroarylalkyl group, a substituted or unsubstituted C5-C30 heteroaryloxy group, a substituted or unsubstituted C5-C30 cycloalkyl group, or a substituted or unsubstituted C5-C30 heterocycloalkyl group;

n is a real number, and $0.01 \leq n \leq 0.99$; and z is a real number, and $5 \leq z \leq 1000$.

The Ar unit of Formula 1 may be selected from the groups represented by 1a through 1n:

where $R_{12}$ and $R_{13}$ are each independently H, a substituted or unsubstituted C1-C12 alkyl group, a substituted or unsubstituted C1-C12 alkoxy group, or a substituted or unsubstituted amino group.

The polymer according to the present invention may contain in its main chain an Ar unit having a spirofluorene structure such as the group represented by Formula 1n. Such a polymer may have high thermal stability, and is less likely to react with neighboring chains to form excimers. The suppression of the formation of excimers results in high efficiency and high color purity of the polymer.

The compound represented by Formula 1 may be a polymer represented by Formula 2:

[Formula 2]

where Y is N or $C(R_1)$;

$R_1$, $R_2$, $R_3$, $R_7$, and $R_8$ are each independently H, a substituted or unsubstituted C1-C20 alkyl group, a substituted or unsubstituted C1-C20 alkoxy group, a substituted or unsubstituted C6-C20 aryl group, a substituted or unsubstituted C6-C20 aryloxy group, or a substituted or unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number, and $5 \leq z \leq 1000$.

A compound represented by Formula 2 in which Y is $C(R_1)$ may be a compound represented by Formula 3:

[Formula 3]

where $R_1$, $R_2$, and $R_3$ are each independently H, a substituted or unsubstituted C1-C20 alkyl group, a substituted or unsubstituted C1-C20 alkoxy group, a substituted or unsubstituted C6-C20 aryl group, a substituted or unsubstituted C6-C20 aryloxy group, or a substituted or unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number, and $5 \leq z \leq 1000$.

In Formula 3, $R_1$ and $R_2$ each may be independently a C1-C12 alkyl group, $R_3$ may be a substituted or unsubstituted C6-C20 aryl group, and $R_{12}$ and $R_{13}$ each may be independently a C1-C12 alkoxy group.

The compound represented by Formula 3 may be a compound represented by Formula 4:

[Formula 4]

where n is a real number, and $0.01 \leq n \leq 0.99$, and z is a real number, and $5 \leq z \leq 1000$.

A compound represented by Formula 2 in which Y is N may be a compound represented by Formula 5:

[Formula 5]

where $R_2$, $R_3$, $R_7$, and $R_8$ are each independently H, a substituted or unsubstituted C1-C20 alkyl group, a substituted or unsubstituted C1-C20 alkoxy group, a substituted or unsubstituted C6-C20 aryl group, a substituted or unsubstituted C6-C20 aryloxy group, or a substituted or unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number, and $5 \leq z \leq 1000$.

In Formula 5, $R_7$ and $R_8$ are each independently a C1-C20 alkyl group or a substituted or unsubstituted C6-C20 aryl group.

Hereinafter, a method of preparing the polymer is described, taking a method of preparing an indenocarbazole polymer represented by Formula 3 (also known as azaindenofluorene) as an example, will be described.

First, an indenocarbazole compound (F) is prepared according to Reaction Scheme 1:

[Reaction Scheme 1]

where $R_1$, $R_2$, and R3 are as previously defined in Formula 3; and $X_1$ through $X_4$ are each a halogen atom.

A halogenated fluorene such as 2-bromofluorene is reacted with a base and alkylhalide to produce a compound (A).

Then, the compound (A) is reacted with trimethyl borate to produce a compound (B). The compound (B) is reacted with an azido reagent, such as 1-azido-2-iodobenzene and the like, to produce a compound (C). The compound (C) is cyclized to produce a compound (D). The compound (D) is reacted with alkylhalide to produce a compound (E). The compound (E) is halogenated to produce an indenocarbazole compound (F).

Finally, the indenocarbazole compound (F) is polymerized with a spirofluorene compound (G) to produce a polymer represented by Formula 3 according to Reaction Scheme 2:

[Reaction Scheme 2]

formula 3 where $X_5$ is a halogen atom.

Other indenocarbazole compound can be prepared using a similar manner as in the above-mentioned manufacturing process.

A weight average molecular weight (Mw) of a blue electroluminescent polymer according to an embodiment of the present invention strongly determines film characteristics of the blue electroluminescent polymer and the lifetime of a device including the film. The weight average molecular weight (Mw) of a blue light polymer may be in the range of about 10,000 to 200,000. When the Mw of the blue light polymer is less than 10,000, a blue electroluminescent polymer of the thin film is crystallized when the device is manufactured and operated. When the Mw of the blue light polymer exceeds 200,000, a conventional preparation method using a Pd(0) or Ni(0)-medium aryl coupling reaction is not suitable for forming the polymer, and further, decreasing light emission characteristics of the device.

In general, a luminescent polymer having a narrow molecular weight distribution (MWD) exhibits excellent electroluminescent characteristics, in particular, a device containing such as polymer has a long lifetime. The blue light polymer according to an embodiment of the present invention may have a MWD of 1.5 to 5.

The unsubstituted alkyl group may be preferably methyl, ethyl, propyl, isobutyl, sec-butyl, tert-butyl, pentyl, iso-amyl, hexyl, or the like. In this case, at least a hydrogen atom contained in the unsubstituted alkyl group may be substituted with a halogen atom; —OH; —NO$_2$; —CN; a substituted or unsubstituted amino group such as —NH$_2$, —NH(R$_{14}$), and —N(R$_{15}$)(R$_{16}$) where R$_{14}$, R$_{15}$, and R$_{16}$ are each independently a C1-C10 alkyl group; an amidino group; hydrazine; hydrazone; a carboxyl group; a sulfonic acid group; phosphoric acid; a C1-C20 alkyl group; a C1-C20 halogenated alkyl group; a C1-C20 alkenyl group; a C1-C20 alkynyl group; a C1-C20 heteroalkyl group; a C6-C20 aryl group; a C6-C20 arylalkyl group; a C6-C20 heteroaryl group; or a C6-C20 heteroarylalkyl group.

The aryl group is a carbocyclic aromatic system including one or more rings. In this case, the rings can be attached to each other using a pendant method or fused with each other. The aryl group may be an aromatic group, including phenyl, naphthyl, tetrahydronaphthyl, or the like. In the aryl group, at least a hydrogen atom can be substituted as in the unsubstituted alkyl group.

The heteroaryl group is a cyclic aromatic system in which the number of cyclic atoms is between 5 and 30. In this case, it is preferred that one, two or three of the cyclic atoms are an element selected from N, O, P, and S. All of the other cyclic atoms are C. The rings can be attached to each other using a pendent method or fused with each other. In the heteroaryl group, at least a hydrogen atom can also be substituted as in the unsubstituted alkyl group.

The unsubstituted alkoxy group may be preferably methoxy, ethoxy, propoxy, isobutyloxy, sec-butyloxy, pentyloxy, iso-amyloxy, hexyloxy, or the like. In the unsubstituted alkoxy group, at least a hydrogen atom can be substituted as in the unsubstituted alkyl group.

The arylakyl group is preferably an aryl group in which one or more of the hydrogen atoms are substituted with an alkyl group of low carbon number, such as methyl, ethyl, propyl, or the like. The arylakyl group may be preferably benzyl, phenylethyl, or the like. In the arylakyl group, at least a hydrogen atom can also be substituted as in the unsubstituted alkyl group.

The heteroarylalkyl group is preferably a heteroaryl group in which one or more of the hydrogen atoms are substituted with an alkyl group of low carbon number. A heteroaryl group contained in the heteroarylalkyl group is as described above. In the heteroarylalkyl group, at least a hydrogen atom can also be substituted as in the unsubstituted alkyl group.

The heteroaryloxy group may be preferably benzyloxy, phenylethyloxy group, or the like. In the heteroaryloxy group, at least a hydrogen atom can be substituted as in the unsubstituted alkyl group.

The cycloalkyl group is preferably a monovalent monocyclic system in which the number of carbon atoms is between 5 and 30. In the cycloalkyl group, at least a hydrogen atom can also be substituted as in the unsubstituted alkyl group.

The heterocycloalkyl group is preferably a monovalent monocyclic system in which the number of cyclic atoms is between 5 and 30. In this case, it is 9 preferred that one, two or three of the cyclic atoms are selected from N, O, P, and S. All of the other cyclic atoms are C. In the heterocycloalkyl group, at least a hydrogen atom can also be substituted as in the unsubstituted alkyl group.

The amino group may be —NH$_2$, —NH(R$_{14}$), or —N(R$_{15}$)(R$_{16}$) where R$_{14}$, R$_{15}$, and R$_{16}$ are each independently a C1-10 alkyl group.

Hereinafter, an organoelectroluminescent device (organic EL device) including the polymer represented by Formula 1, and a method of manufacturing the same will be described.

FIGS. 1A through 1F are sectional views of organic EL devices according to exemplary embodiments of the present invention.

Figure 1A:
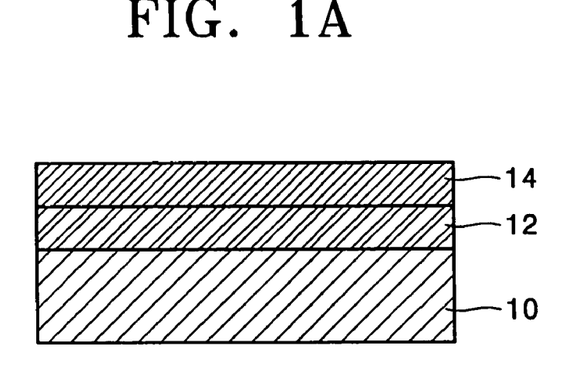
FIGS. 1A through 1F are sectional views of organoelectroluminescent devices according to embodiments of the present invention.

Referring to FIG. 1A, an organic EL device according to exemplary embodiments of the present invention includes a first electrode 10, an emission layer 12 composed of the blue light polymer represented by Formula 1, and a second electrode 14 stacked sequentially.

Figure 1B:
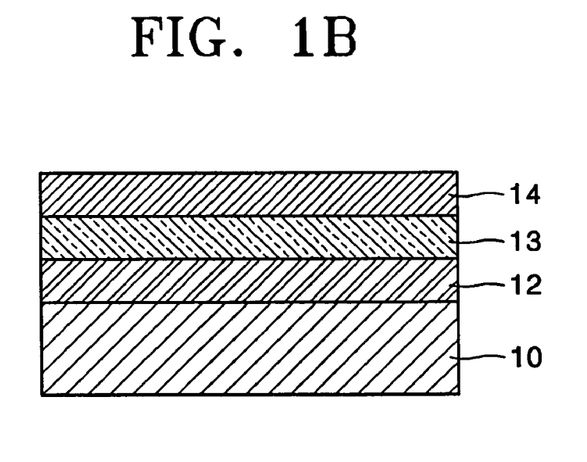

Referring to FIG. 1B, an organic EL device includes a first electrode 10, an emission layer 12 composed of the blue light polymer represented by Formula 1, a hole blocking layer (HBL) 13, a second electrode 14 sequentially formed.

Figure 1C:
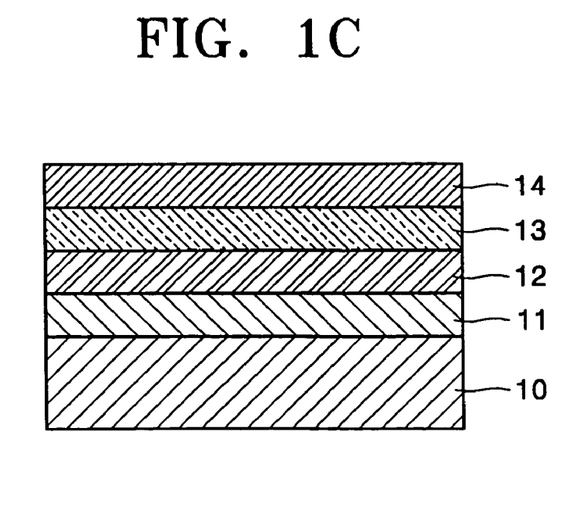

Referring to FIG. 1C, an organic EL device has the same laminated structure as in FIG. 1B, except that a hole injection layer (HIL) (also known as 'buffer layer') 11 is interposed between the first electrode 10 and the emission layer 12.

Figure 1D:
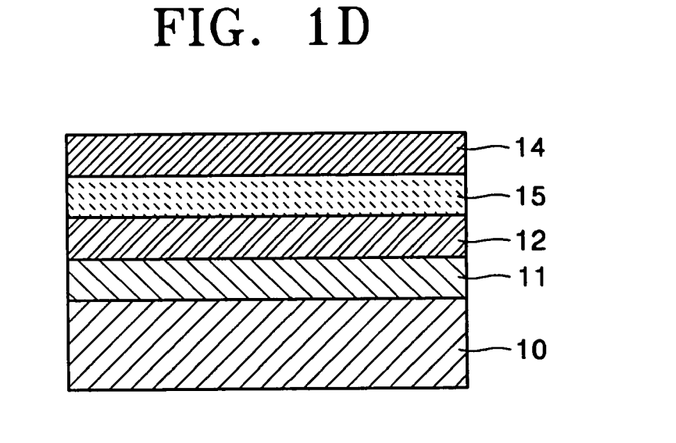

Referring to FIG. 1D, an organic EL device has the same laminated structure as in FIG. 1C, except that the hole blocking layer (HBL) 13 formed on the emission layer 12 is replaced by an electron transport layer (ETL) 15.

Figure 1E:
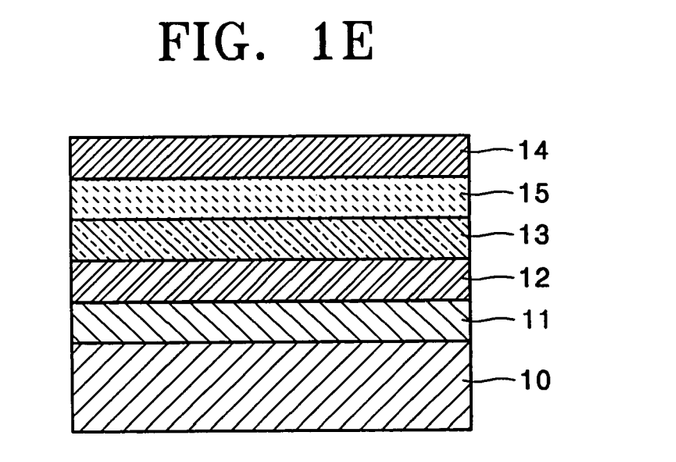

Referring to FIG. 1E, an organic EL device has the same laminated structure as in FIG. 1C, except that the hole blocking layer (HBL) 13 and an electron transport layer (ETL) 15 sequentially deposited are formed instead of the hole blocking layer (HBL) 13 formed on the emission layer 12.

Figure 1F:
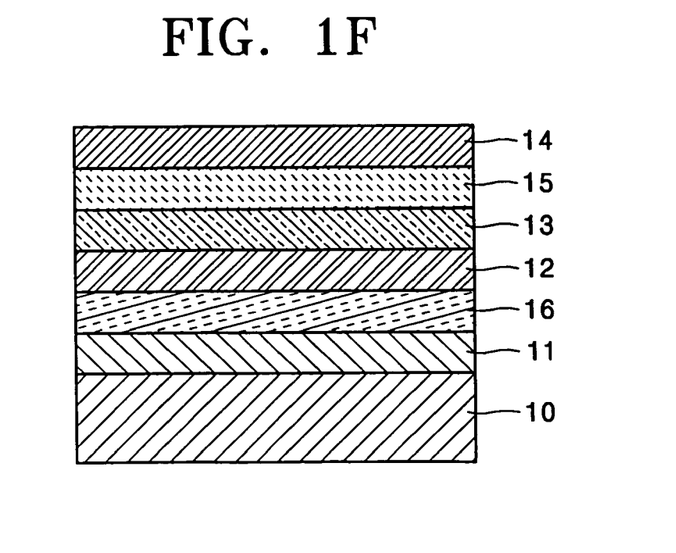

Referring to FIG. 1F, an organic EL device has the same laminated structure as in FIG. 1E, except that a hole transport layer 16 is interposed between the hole injection layer 11 and the emission layer 12. The hole transport layer 16 blocks permeation of impurities from the hole injection layer 11 to the emission layer 12.

The organic EL devices shown in FIGS. 1A through 1F can be manufactured using a conventional manufacturing method, but is not limited thereto.

A method of manufacturing an organic EL device according to an exemplary embodiment of the present invention will now be described.

First, a patterned first electrode 10 is formed on a substrate (not shown). Any substrate that is used in common organic EL devices can be used in the present embodiment. The substrate may be composed of glass or transparent plastic which are all transparent, have uniform surfaces, are waterproof, and are easily handled. The substrate may have a thickness of 0.3 to 1.1 mm.

The first electrode 10 may be composed of various materials. When the first electrode 10 is a cathode, the cathode is composed of a conducting metal or an oxide thereof, which allows holes to be smoothly injected. In detail, the cathode may be composed of Indium Tin Oxide (ITO), Indium Zinc Oxide (IZO), Ni, Pt, Au, Ir, or the like.

The substrate on which the first electrode 10 is formed is cleaned using an organic solvent. The organic solvent may be isopropanol (IPA), acetone, or the like. The cleaned substrate is subjected to a UV/$O_3$ treatment.

A hole injection layer 11 is optionally formed on the first electrode 10, which is formed on the substrate. The hole injection layer 11 decreases a contact resistance between the first electrode 10 and an emission layer 12 and increases a hole transport capacity of the first electrode 10 with respect to the emission layer 12. As a result, a device including the hole injection layer 11 has a low driving voltage and a long lifetime. The hole injection layer 11 can be composed of commonly used materials. In detail, the hole injection layer 11 may be composed of poly(3,4-ethylenedioxythiophene)(PEDOT)/polystyrene parasulfonate(PSS), starburst-based materials, copper phthalocyanine, polythiophene, polyaniline, polyacetylene, polypyrrole, polyphenylene vinylene, or derivatives of these.

One of these materials is spin coated on the first electrode 10, and then dried to form the hole injection layer 11. The hole injection layer 11 may have a thickness of 300-2000 Å, and preferably 500-1100 Å. When the thickness of the hole injection layer 11 is outside of this range, hole injection characteristics deteriorate. A drying temperature may be preferably in the range of 100-250° C.

A composition for forming the emission layer 12 is, for example, spin coated on the hole injection layer 11, and then dried to form the emission layer 12. In this case, the composition for forming the emission layer 12 includes the polymer represented by Formula 1 and a solvent. The amount of the polymer represented by Formula 1 is in the range of 0.1-3.0 parts by weight, and the amount of the solvent is in the range of 97.0-99.9 parts by weight, based on 100 parts by weight of the composition.

Any solvent that can dissolve the polymer represented by Formula 1 can be used in the present embodiment. The solvent may be toluene, chlorobenzene, or the like.

Optionally, a dopant may be further added to the composition for forming the emission layer 12. In this case, an amount of the dopant may vary according to the composition for forming the emission layer 12. However, in general, the amount of the dopant may be in the range of 30-80 parts by weight based on 100 parts by weight of the material for forming the emission layer 12, which is composed of a host of the polymer represented by Formula 1 and the dopant. When the amount of the dopant is outside of the range, emission characteristics of the EL device deteriorates, which is undesirable. The dopant may be an arylamine, a perylene, a pyrrole, a hydrazone, a carbazole, a stilbene, a starburst-based compound, an oxadiazole, or the like.

The thickness of the emission layer 12 can be adjusted by the concentration of the composition for forming the emission layer 12, and by the angular velocity used in the spin coating process. The emission layer 12 may have a thickness of 100-1000 Å, and preferably 500-1000 Å. When the thickness of the emission layer 12 is less than 100 Å, luminous efficiency decreases. When the thickness of the emission layer 12 exceeds 1000 Å, the driving voltage of the organic EL device increases, which is undesirable.

A hole transport layer 16 is optionally interposed between the hole injection layer 11 and the emission layer 12. The hole transport layer 16 can be composed of any material that can carry holes. The hole transport layer 16 may be composed of polytriphenylamine, or the like. The hole transport layer 16 may have a thickness of 100-1000 Å.

A hole blocking layer 13 and/or an electron transport layer 15 are formed on the emission layer 12 by deposition and spin coating. The hole blocking layer 13 hinders excitons generated in the emission layer 12 from migrating to the electron transport layer 15, and holes from migrating to the electron transport layer 15.

The hole blocking layer 13 may be composed of LiF or $MgF_2$, a phenanthroline such as BCP (obtained from UDC Co.), an imidazole, a triazole, an oxadiazole such as PBD, an aluminum complex such as BAlq (obtained from UDC Co.), or their derivatives. The exemplary compounds for the hole blocking layer 13 are represented by the formulae below:

phenanthroline derivative;

imidazole derivative triazole derivative;

oxadiazole derivative; and

BAlq.

The electron transport layer 15 may be composed of a oxazole; an isoxazole; triazoles; an isothiazole; an oxadiazole; a thiadiazole; a perylene; an aluminum complex including Alq3(tris(8-quinolinolato)-aluminum), BAlq, SAlq, Almq3; or a Ga complex, such as Gaq'2OPiv, Gaq'2OAc, or 2(Gaq'2).

perylenes

Alq3

BAlq

The hole blocking layer 13 may have a thickness of 100-1000 Å. The electron transport layer 15 may have a thickness of 100-1000 Å. When the thickness of the hole blocking layer 13 is outside of the designated range, the electron transporting ability decreases, which is undesirable. When the thickness of the electron transport layer 15 is outside of the designated range, electron transporting ability decreases, which is undesirable.

Subsequently, a second electrode 14 is formed on the electron transport layer 15 by deposition, and then sealed to complete an organic EL device.

The second electrode 14 may be composed of, for example, a low work function metal. The low work function metal may be Li, Ca, Ca/Al, LiF/Ca, LiF/Al, Al, Mg, a Mg alloy, or the like. The second electrode 14 may have a thickness of 50-3000 Å.

Although the polymer represented by Formula 1 according the present embodiment is used to form an emission layer of an organic EL device, a hole transport layer can also be composed of the polymer. Further, the polymer can be used as a medium in biotechnology.

An organic EL device according to an embodiment of the present invention can be manufactured according to a conventional method using a luminous polymer.

The present invention will be described in further detail with reference to the following examples. The following examples are for illustrative purposes and are not intended to limit the scope of the present invention.

PREPARATION EXAMPLE 1

Manufacturing a Polymer Represented by Formula 4

[Reaction Scheme 3]

-continued (A')

(B')

(C')

(D')

(E')

-continued (F')

A) Preparation of 2-bromo-9,9'-dioctylfluorene (A')

24.5 g of 2-bromofluorene (100 mmol) was dissolved in 200 ml of dimethylsulfoxide (DMSO), and then 14.5 g of KOH (259 mmol) was added thereto. The result was stirred for 20 minutes. 42.5 g of bromooctane (220 mmol) was added to the stirred mixture, and then stirred at room temperature for 16 hours.

After the reaction was completed, 300 ml of distilled water was added to the reaction mixture, and then extracted using chloroform to concentrate the mixture. This concentrated result was column-chromatographed using hexane as an eluent to produce 46.9 g of 2-bromo-9,9'-dioctylfluorene (A') (yield: 94%).

B) Preparation of 9,9'-dioctylfluorenyl-2-boronic acid (B')

40.8 g of 2-bromo-9,9'-dioctylfluorene(A') (87 mmol) was dissolved in 150 ml of anhydrous tetrahydrofuran (THF). 2.11 g of Mg (86.8 mmol) and a trace of $I_2$ were added to the result, and then refluxed for 4 hours. Then, the reaction mixture was cooled to room temperature. The cooled reaction mixture was added to a $B(OCH_3)_3$ solution, which was prepared by dissolving 27.14 g of $B(OCH_3)_3$ (261.2 mmol) in 150 ml of THF and then cooling to −78° C. The result was stirred at room temperature for 16 hours.

After the reaction was completed, the reaction mixture was added to 200 ml of 1M HCl, and then stirred for 3 hours. Then, an organic layer was separated from the stirred result, concentrated, column chromatographed, and concentrated again to produce 32.4 g of 9,9'-dioctylfluorenyl-2-boronic acid (B') (yield: 85.74%).

9,9'-dioctylfluorenyl-2-boronic acid (B') was a yellow oil.

C) Preparation of 2-(2-azido-phenyl)-9,9-dioctylfluorene (C')

32.37 g of 9,9'-dioctylfluorenyl-2-boronic acid (B') (74.58 mmol), 18.27 g of 1-azido-2-iodo-benzene (74.56 mmol), and 8.62 g of 5 mol % $Pd(PPh_3)_4$ (7.46 mmol) were dissolved in 200 ml of toluene, and then 100 ml of 2M $Na_2CO_3$ was added thereto. The result was refluxed for 12 hours.

After the reaction was completed, an organic layer was separated from the reaction mixture, concentrated, and then column chromatographed using hexane as an eluent to produce 35 g of 2-(2-azido-phenyl)-9,9-dioctylfluorene (C') (yield: 92%).

D) Preparation of 12,12-dioctyl-6,12-dihydro-6-aza-indeno [1,2-b]fluorene}(D')

19.9 g of 2-(2-azido-phenyl)-9,9-dioctylfluorene (C') was dissolved in 100 ml of o-dichlorobenzene, and then refluxed at 180° C. for 12 hours.

After the reaction was completed, the reaction mixture was concentrated under a reduced pressure, and then column chromatographed using toluene as an eluent to produce 7.7 g of 12,12-dioctyl-6,12-dihydro-6-aza-indeno [1,2-b]fluorene (D') (yield: 39%).

E) Preparation of 6-(4-butylphenyl)-12,12-dioctyl-6,12-dihydro-6-aza-indeno[1,2-b]fluorene (E')

4.4 g of 12,12-dioctyl-6,12-dihydro-6-aza-indeno[1,2-b]fluorene (D') (9.16 mmol), 2.29 g of 1-bromo-4-octyloxybenzene, 0.18 g of tris(di-benzylideneacetone)di-paladium(O), 1.28 g of t-BuONa, and 0.003 g of t-butylphosphine were dissolved in 50 ml of xylene, and then refluxed at 120° C. for 24 hours.

After refluxing, the solvent was removed. The solvent-free reaction mixture was column chromatographed using a mixture of toluene and hexane in a volume ratio of 1:3 as an eluent to produce 5.59 g of 6-(4-butylphenyl)-12,12-dioctyl-6,12-dihydro-6-aza-indeno[1,2-b]fluorene (E') (yield: 79%).

F) Preparation of 6-(4-butyl)-2,9-diiodo-phenyl 12,12-dioctyl-6,12-dihydro-6-aza-indeno[1,2-b]fluorene (F')

3.5 g of 6-(4-butylphenyl)-12,12-dioctyl-6,12-dihydro-6-aza-indeno[1,2-b]fluorene (E') was dissolved in 150 ml of chloroform, and then 2.65 g of $CF_3COOAg$ (11.4 mmol) was added thereto. Then, 3.03 g of 12 (11.93 mmol) dissolved in 150 ml of chloroform was slowly added to the result, and then reacted at room temperature for 6 hours.

After the reaction was completed, the reaction mixture was neutralized using 2M $K_2CO_3$ aqueous solution, and then extracted using water and chloroform to separate a chloroform layer. The solvent was removed from the separated chloroform layer. The result was column chromatographed using a mixture of toluene and hexane in a volume ratio of 1:3 as an eluent to produce 2.5 g of 6-(4-butyl)-2,9-diiodo-phenyl 12,12-dioctyl-6,12-dihydro-6-aza-indeno[1,2-b]fluorene (F') (yield: 40%).

G) Preparation of a polymer represented by Formula 4

First, an inside of a schlenk flask was vacuumed several times and refluxed using nitrogen to completely remove moisture. Next, 880 mg of bis 1,5-cyclooctadiene nickel (3.2 mmol) and 500 mg of bipyridine (3.2 mmol) were added into the moisture-free schlenk flask in a nitrogen glove box. Then, the inside of the schlenk flask was vacuumed several times and purged using nitrogen. 10 ml of anhydrous dimethylformamide (DMF), 346 mg of 1,5-cyclooctadiene (COD) (3.2 mmol), and 10 ml of anhydrous toluene were added to the result, and then stirred at 80° C. for 30 minutes. 13.8 mg of the compound (F') (0.16 mmol) and 1.05 g of 2,7-dibromo 2',3'-di(2-ethyl)hexyoxy spirofluorene (G') (1.44 mmol) diluted in 10 ml of toluene were added to the stirred result under an $N_2$ atmosphere. Then, 10 ml of toluene was added into the flask such that materials adhered to the surface of the flask wall were fully incorporated into the solution. The result was stirred at 80° C. for 4 days, and then 36.1 mg of (4-bromophenyl)diphenylamine (0.112 mmol) was added thereto, and stirred at 80° C. for about a day.

After the reaction was completed, the reaction mixture was cooled to room temperature, and then added to a solution mixture of HCl, acetone, and methanol in a volume ratio of 1:1:2 to form precipitations. The precipitations were dissolved in chloroform, and then added to methanol to form precipitations again. The resulting precipitations were extracted using soxhlet extractor to produce 450 mg of the polymer represented by Formula 4, wherein n is 0.9. The polymer was analyzed using gel permeation chromatography (GPC). As a result, the number average molecular weight (Mn) was 28,000, and the molecular weight distribution (MWD) was 3.57. In Formula 4, z was 5 to 1000.

The polymer manufactured in Preparation Example 1 was identified using a UV absorbance spectrum and a photoluminescent spectrum. The results are shown in FIGS. 2 and 3.

Figure 2:
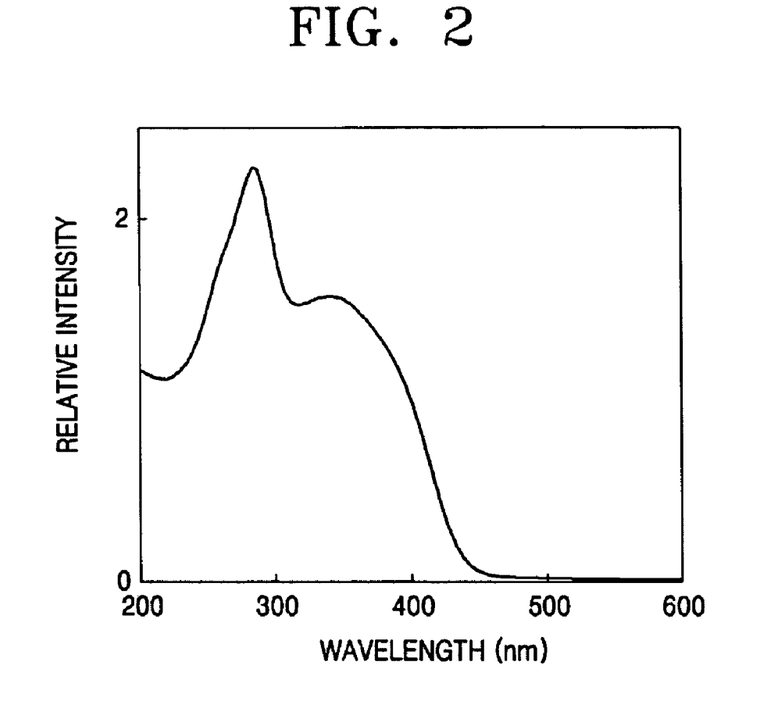
FIG. 2 and FIG. 3 are a UV absorbance spectrum and a light emission spectrum of a polymer prepared in Preparation Example 1, respectively.
Figure 3:
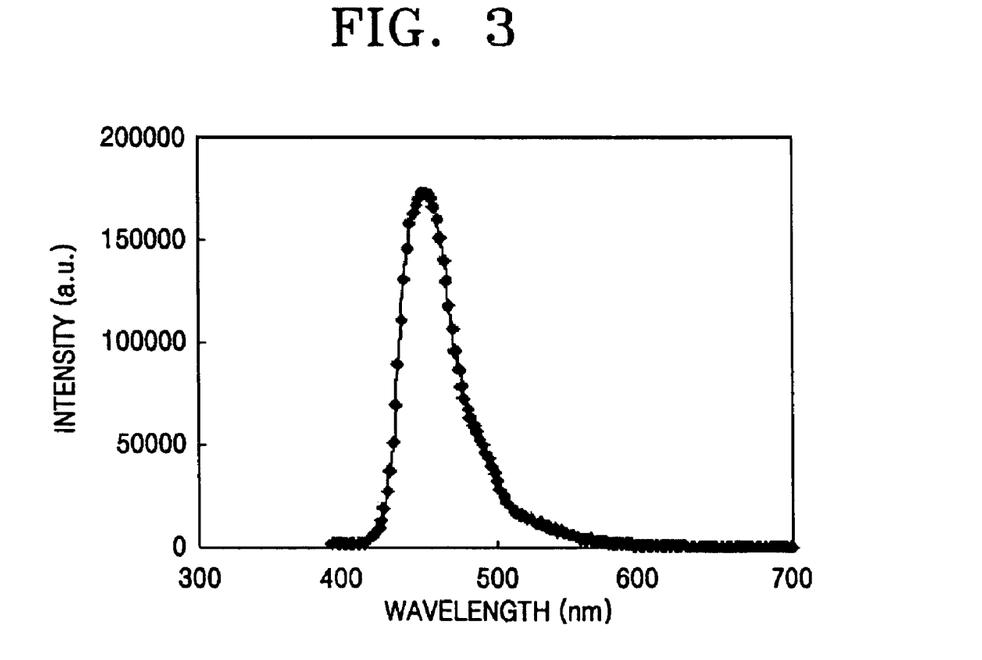

Referring to FIGS. 2 and 3, it is confirmed that the polymer has blue light electroluminescence characteristics.

EXAMPLE 1

Manufacturing an Organic EL Device

An organic EL device was manufactured using the polymer represented by Formula 4 prepared in Preparation Example 1.

First, indium-tin oxide (ITO) was coated on a transparent glass substrate. The ITO layer was patterned in a desirable form using a photosensitive resin and etchant, and then cleaned. Then, Batron P 4083 (obtained from Bayer Co.) was coated on the ITO layer to form a conducting buffer layer. The conducting buffer layer had a thickness of 800 Å. The result was baked at 180° C. for one hour. Then, 1 part by weight of the polymer represented by Formula 4 was dissolved in 99 parts by weight of toluene to prepare a composition for forming an emission layer. In order to form a polymer thin film, the buffer layer was spin coated with the composition for forming the emission layer and then baked in a vacuum oven to completely remove the solvent. At this time, before the spin coating, the composition for forming the emission layer was filtered using a 0.2 mm filter. The emission layer had a thickness of about 80 nm. The thickness of the emission layer was adjusted by varying the concentration of the composition for forming the emission layer and the spin speed.

Then, Ca and Al were sequentially deposited on the polymer thin film by vacuum deposition under a pressure of less than 4×10⁻⁶ torr. At this time, thicknesses and growth speeds of Ca and Al layers were controlled by a crystal sensor.

Figure 4:
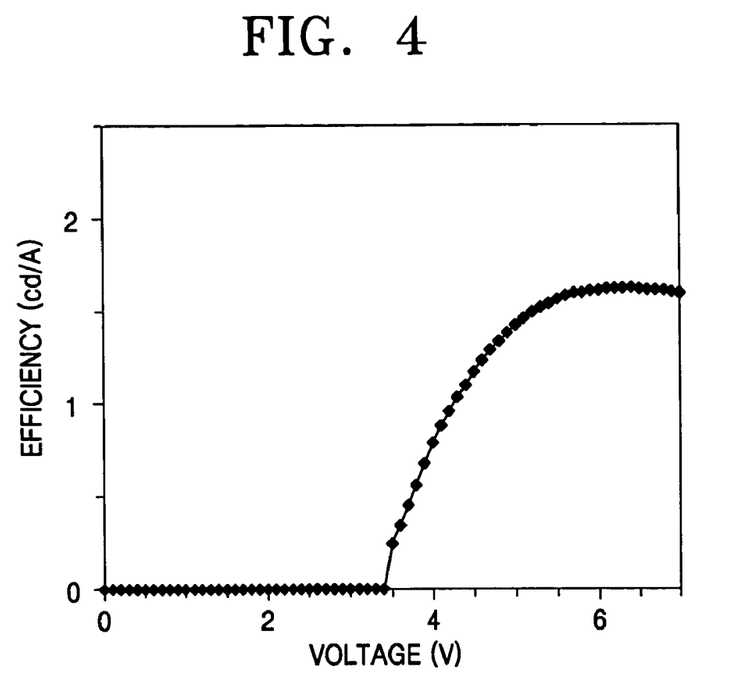
FIG. 4 is a graph of efficiency of an organoelectroluminescent device according to Example 1 with respect to voltage.
Figure 5:
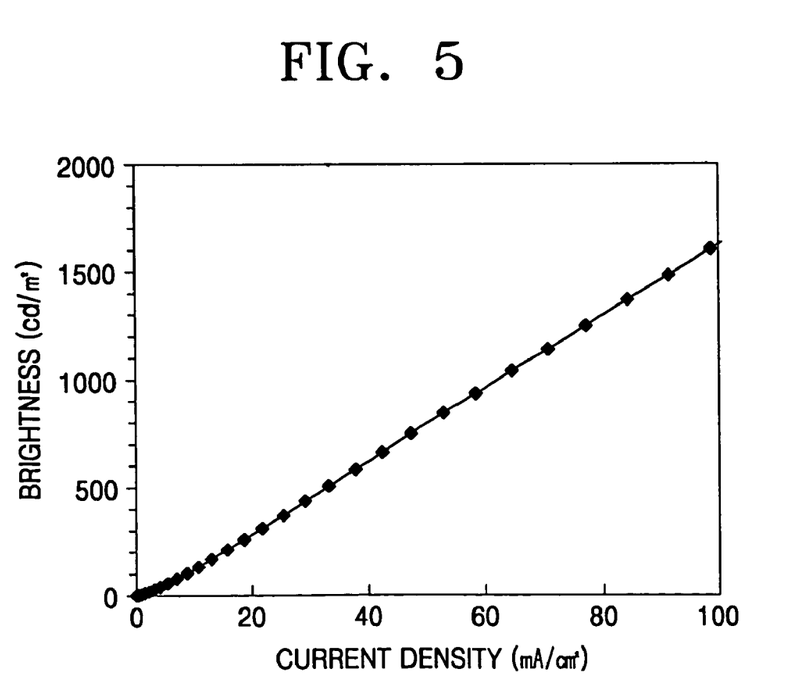
FIG. 5 is a graph of brightness of an organoelectroluminescent device according to Example 1 with respect to current density.

A forward bias voltage was applied to the organic EL device manufactured in Example 1 to measure its efficiency and brightness characteristics. The results are shown in FIGS. 4 and 5. The typical rectifying diode characteristics of the organic EL device were also measured. In particular, the organic EL device including the polymer prepared in Example 1 exhibited constant voltage-current density characteristics even after being operated several times.

As is apparent from FIGS. 4 and 5, the organic EL device manufactured in Example 1 exhibited excellent brightness and efficiency characteristics.

Figure 6:
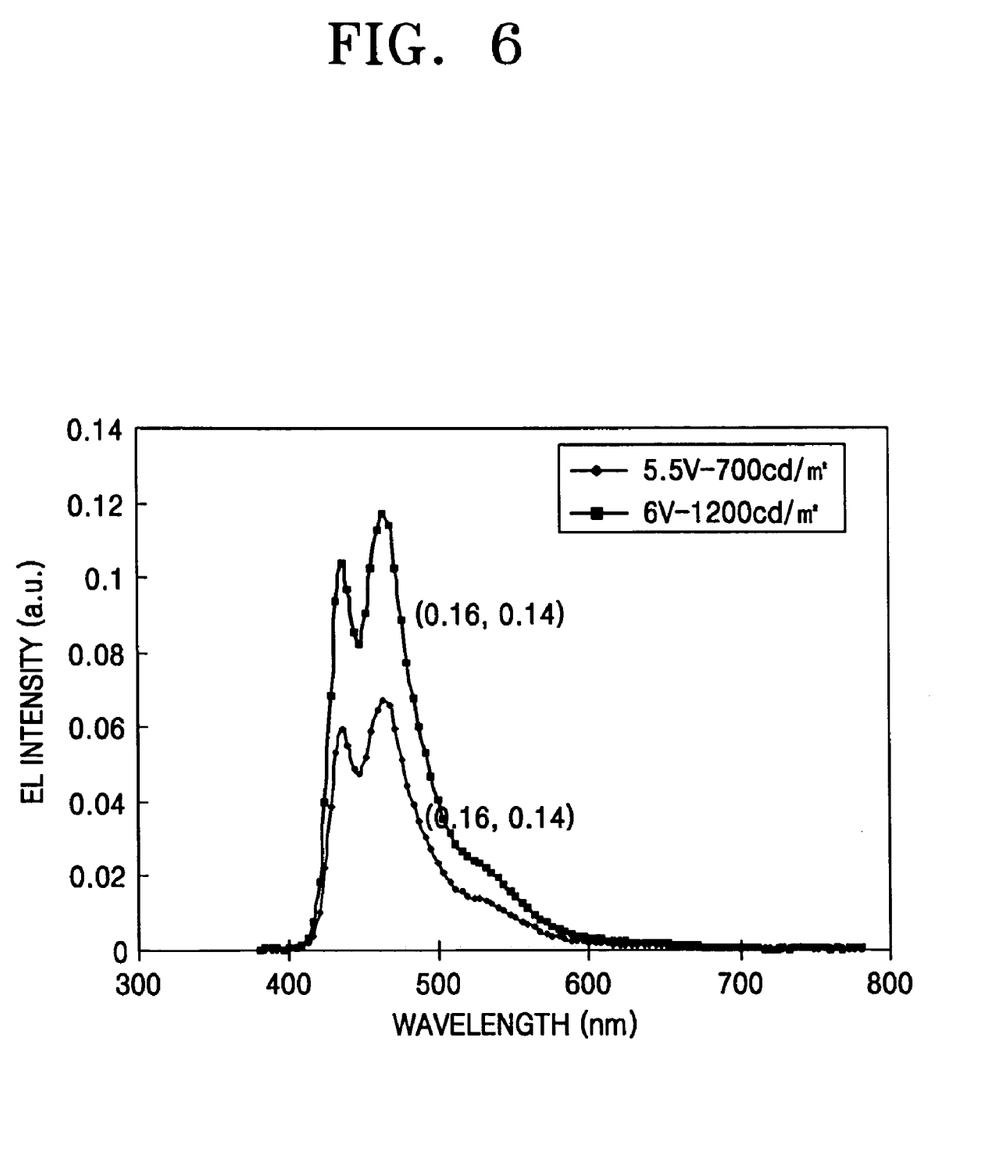
FIG. 6 illustrates an electroluminescent spectrum and chromaticity characteristics of an organoelectroluminescent device according to Example 1.

FIG. 6 illustrates an electroluminescent spectrum and chromacity characteristics of the organic EL device manufacture in Example 1. Referring to FIG. 6, the organic EL device exhibited blue light emission characteristics with high purity. In particular, even when a voltage applied varied, the excellent color purity of the organic EL device was maintained.

As described above, an indenocarbazole polymer according to the present invention exhibits blue light electroluminescence characteristics. In addition, the polymer can be easily manufactured, and emits blue light. Further, an organic EL device using an organic film of the polymer has excellent color purity, efficiency, and brightness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer represented by Formula 3:

[Formula 3]

where $R_1$, $R_2$, and $R_3$ are each independently selected from the group consisting of H, a substituted C1-C20 alkyl group, an unsubstituted C1-C20 alkyl group, a substituted C1-C20 alkoxy group, an unsubstituted C1-C20 alkoxy group, a substituted C6-C20 aryl group, an unsubstituted C6-C20 aryl group, a substituted C6-C20 aryloxy group, an unsubstituted C6-C20 aryloxy group, a substituted C2-C20 heteroaryl group, an unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number, and $5 \leq z \leq 1000$.

2. The polymer of claim 1, wherein a weight average molecular weight of the polymer is in the range of about 10,000 to 200,000 and a molecular weight distribution of the polymer is in the range of 1.5 to 5.

3. The polymer of claim 1, wherein $R_1$ and $R_2$ are each a C1-C12 alkyl group, $R_3$ is a substituted or unsubstituted C6-C20 aryl group, and $R_{12}$ and $R_{13}$ are each a C1-C12 alkoxy group.

4. The polymer of claim 1, wherein the polymer is represented by Formula 4:

[Formula 4]

where n is a real number and $0.01 \leq n \leq 0.99$, and z is a real number and $5 \leq z \leq 1000$.

5. An organoelectroluminescent device, comprising:
a pair of electrodes;
an organic film interposed between the pair of electrodes, the organic film comprising a polymer represented by Formula 3:

[Formula 3]

where $R_1$, $R_2$, and $R_3$ are each independently selected from the group consisting of H, a substituted C1-C20 alkyl group, an unsubstituted C1-C20 alkyl group, a substituted C1-C20 alkoxy group, an unsubstituted C1-C20 alkoxy group, a substituted C6-C20 aryl group, an unsubstituted C6-C20 aryl group, a substituted C6-C20 aryloxy group, an unsubstituted C6-C20 aryloxy group, a substituted C2-C20 heteroaryl group, an unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number, and $5 \leq z \leq 1000$.

6. The organoelectroluminescent device of claim 5, wherein the organic film is an emission layer or a hole transport layer.

7. The organoelectroluminescent device of claim 5, wherein a weight average molecular weight of the polymer is in the range of about 10,000 to 200,000 and a molecular weight distribution of the polymer is in the range of 1.5 to 5.

8. The organoelectroluminescent device of claim 5, wherein $R_1$ and $R_2$ are each a C1-C12 alkyl group, $R_3$ is a substituted or unsubstituted C6-C20 aryl group, and $R_{12}$ and $R_{13}$ are each a C1-C12 alkoxy group.

9. The organoelectroluminescent device of claim 5, wherein the polymer is represented by Formula 4:

[Formula 4]

where n is a real number, and $0.01 \leq n \leq 0.99$, and z is a real number and $5 \leq z \leq 1000$.

10. An organoelectroluminescent device, comprising:
a pair of electrodes;
an organic film interposed between the pair of electrodes, the organic film comprising a polymer, a weight average molecular weight of the polymer being in the range of about 10,000 to 200,000, the polymer represented by Formula 3:

[Formula 3]

where $R_1$, $R_2$, and $R_3$ are each independently H, a substituted or unsubstituted C1-C20 alkyl group, a substituted or unsubstituted C1-C20 alkoxy group, a substituted or unsubstituted C6-C20 aryl group, a substituted or unsubstituted C6-C20 aryloxy group, or a substituted or unsubstituted C2-C20 heteroaryl group;

$R_{12}$ and $R_{13}$ are each independently H, a substituted or unsubstituted C1-C12 alkyl group, a substituted or unsubstituted C1-C12 alkoxy group, or a substituted or unsubstituted amino group;

n is a real number, and $0.01 \leq n \leq 0.99$; and z is a real number and $5 \leq z \leq 1000$.

11. The organoelectroluminescent device of claim 5, wherein a molecular weight distribution of the polymer is in the range of 1.5 to 5.

* * * * *